(12) United States Patent
Fujimoto

(10) Patent No.: US 6,812,155 B2
(45) Date of Patent: Nov. 2, 2004

(54) PATTERN FORMATION METHOD

(75) Inventor: Masashi Fujimoto, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 108 days.

(21) Appl. No.: 10/342,796

(22) Filed: Jan. 15, 2003

(65) Prior Publication Data
US 2003/0139054 A1 Jul. 24, 2003

(30) Foreign Application Priority Data
Jan. 17, 2002 (JP) .................................... 2002-008531

(51) Int. Cl.⁷ ...................... H01L 21/302; H01L 21/461
(52) U.S. Cl. ....................................................... 438/725
(58) Field of Search ............................... 438/725, 717, 438/947, 942, 514, 531

(56) References Cited

U.S. PATENT DOCUMENTS
5,432,044 A * 7/1995 Shimizu ..................... 430/269

FOREIGN PATENT DOCUMENTS
JP              62-50811           10/1987

* cited by examiner

Primary Examiner—Craig A. Thompson
(74) Attorney, Agent, or Firm—Scully, Scott, Murphy & Presser

(57) ABSTRACT

A pattern formation method of the present invention is one that forms a circuit pattern in a resist film upon a wafer 141 by exposure using a plurality of phase-shift masks. A first phase-shift mask is for an isolated pattern including a pattern with a distance between adjacent patterns (inter-pattern distance) W1 of at least 400 nm, and a second phase-shift mask is for a dense pattern including patterns with inter-pattern distances W2 under 400 nm. Affects of the optical proximity effect are eliminated through providing optimum exposure conditions for the distances between adjacent patterns W1 and W2 using the plurality of phase-shift masks in accordance with respective inter-pattern distances W1 and W2.

12 Claims, 12 Drawing Sheets

PATTERN FORMATION METHOD

BACKGROUND OF THE INVENTION

1. Field of the Invention

The present invention, in the field of microscopic processing technology for semiconductor fabrication and the like, relates to a pattern formation method, which forms a predetermined pattern in a resist film upon a wafer through exposure using phase-shift masks. Hereinafter, exposure using phase-shift masks is abbreviated as "phase-shift exposure".

2. Description of the Related Art

In recent years, miniaturization in pattern dimensions have become increasingly necessary as achievements in high-speed and high levels of integration in semiconductor devices are made. As a result, design rules have become reduced to approximately half the exposure wavelength.

For example, FIG. 8 shows optical contrast in the case where, for example, a 100 nm isolated line is exposed onto a photoresist layer through KrF excimer exposure (wavelength 248 nm) or ArF excimer exposure (wavelength 193 nm). The 100 nm isolated line is a line that has a plurality of linear pattern elements of width 100 nm arranged in parallel at equal intervals. Optical contrast is defined as (light intensity at pattern center–light intensity at pattern edge)÷(light intensity at pattern edge), whereby it is believed that a value of approximately 0.5 or more is necessary for resolving a pattern into a preferred shape. On the other hand, in formation of patterns with width of approximately 100 nm, pattern width is less than half the exposure wavelength. As can be seen from FIG. 8, in formation of patterns with microscopic widths to this degree, resolving into the preferred shape using a normal mask subjected to exposure techniques is extremely difficult since the optical contrast is smaller than 0.5. Thus, various "super resolution techniques" are under review. Among them, the "Levinson phase-shift mask" (see Japanese Patent Application Laid-open Sho 62-50811) is considered as the most promising technique in formation of patterns less than half the exposure wavelength since the optical contrast and resolution improving effects are significant.

FIG. 9A to FIG. 9C are top views illustrating a pattern formation method through conventional phase-shift exposure, wherein FIG. 9A is a phase-shift mask used in a first exposure, FIG. 9B is a normal mask used in a second exposure, and FIG. 9C is a circuit pattern formed through these exposures. Width $W_s$ of the line patterns shown in FIG. 9C is 100 nm. Description thereof is based on these drawings hereinafter.

A phase-shift mask 40 shown in FIG. 9A is used in the first exposure. The phase-shift mask 40 is a positive type Levinson phase-shift mask, and has an L-shaped light shielding portion 421b and linear light shielding portions 421a. The phase-shift mask 40 has a phase-shifter 422b, which is formed adjacently to the L-shaped light shielding portion 421b, and phase-shifters 422a, which are alternately arranged in the spaces between the linear light shielding portions 421a. The region other than the L-shaped light shielding portion 421b, linear light shielding portions 421a, phase-shifter 422b and phase-shifters 422a of the phase-shift mask 40 is made to be a transmissive portion 423. Since the phases of the exposure light that passes through the transmissive portion 423 do not change, "0" is given to the transmissive portion 423 in FIG. 9A; and since the exposure light that passes through the phase-shifters 422a and 422b changes in phase only by π (180), "π" is given. The phases of the exposing light that passes through the transmissive portion 423 adjacent to the shielding portions 421a and the exposing light that passes through the phase-shifters 422a differ precisely 180. During the first exposure, the photo-electric fields at the borders of the transmissive portion 423 with the phase-shifters 422a and 422b are completely neutralized, forming an image with an extremely sharp dark area. The dark area formed at the 0-π border is called a phase edge. The second exposure subsequently performed is exposure for preventing unnecessary dark areas including the phase edge from being resolved as resist patterns. In other words, using the normal mask 42 shown in FIG. 9B, all of the line pattern regions and L-shaped pattern regions formed through the first phase-shift exposure are shielded from the light so as to expose the remaining regions. In particular, the unnecessary dark area formed at the 0-π border is exposed to be eliminated. A circuit pattern 44 is then achieved upon a wafer 441 by executing a development procedure.

However, there are problems such as the following in a conventional pattern formation method through phase-shift exposure.

FIG. 10 shows what happens to dimensions (width $W_s$) of a pattern to be actually formed in accordance with the distance between adjacent patterns (inter-pattern distance) W in the case where a line pattern where width $W_s$ is 100 nm is exposed by phase-shift exposure. As shown in FIG. 10, pattern dimensional accuracy drastically decreases due to affects of the optical proximity effect with the inter-pattern distance W equal to or less than 400 nm.

Based on a fixed value for the inter-pattern distance W, a pattern with inter-pattern distance W larger than the fixed value is defined as an isolated pattern 461, and a pattern with inter-pattern distance W smaller than the fixed value is defined as a dense pattern 462. Conventionally, as shown in FIG. 9C, the isolated pattern 461 with the large inter-pattern distance W and the dense pattern 462 with the small inter-pattern distance W have been simultaneously exposed with the same phase-shift mask 40. At this time, should the isolated pattern 461 and the dense pattern 462 be exposed as line patterns with same dimensions, there have been problems where dimensional differences of the pattern actually formed significantly increase. For example, as shown in FIG. 10, if a pattern where width $W_s$ is 100 nm is exposed, a 40 nm dimensional difference between the pattern actually formed with the isolated pattern and dense pattern arises. Correcting (optical proximity correction) such large dimensional differences on the reticle side is extremely difficult.

Furthermore, with conventional phase-shift exposure, as shown in FIG. 11, there have been problems where pattern dimensions drastically thicken as defocus, that is wafer surface asperities, increases. Thus, pattern dimensions vary in response to the irregular structure of the wafer surface.

Moreover, as in FIG. 12, since asymmetry in +, – defocusing has occurred when spherical aberrations persist, there have been problems of dimensional accuracy significantly deteriorating. Asymmetry in +, – defocusing indicates that even if the absolute value of the plus defocus for a given point and the absolute value of the minus defocus for another point is the same, the pattern dimensions at these points do not match. By constructively utilizing phase information under highly coherent conditions for image formation, phase-shift exposure becomes extremely sensitive to optical parameters on that principle. Consequently, the exposure is extremely affected particularly by the effects of lens aberrations that emerge as phase errors during image formation.

Accordingly, the aim of the present invention is to provide a pattern formation method through phase-shift exposure, which improves dimensional accuracy by eliminating effects of defocus and spherical aberrations in addition to affects of the optical proximity effect.

SUMMARY OF THE INVENTION

The present invention is a pattern formation method, which forms a predetermined pattern in a resist film upon a wafer through exposure using phase-shift masks, characterized by using differing phase-shift masks in response to an inter-pattern distance, which is the distance between adjacent patterns, and exposing under respective adequate conditions for respective phase-shift mask exposures. For example, reducing the amount of exposure as the inter-pattern distance becomes shorter, or exposing using focus offset that differs according to the inter-pattern distance. Furthermore, a first phase-shift mask with inter-pattern distances of at least a fixed value and a second phase-shift mask with inter-pattern distances less than the fixed value may also be used. The optical proximity effect depends on inter-pattern distance as well as exposure conditions. Accordingly, using phase-shift masks that differ according to inter-pattern distance, providing optimum exposure conditions for respective inter-pattern distances allows for eliminating affects of the optical proximity effect.

Regarding the differing phase-shift masks, one phase-shift mask may have a mask pattern that eliminates the phase edges generated in another phase-shift mask. In this case, since the phase-shift mask also has functions of the normal mask, the normal mask is eliminated.

Furthermore, at least one of either the phase-shift mask or the wafer may be exposed while being shifted a fixed distance along the optical axis. In the case where the first phase-shift mask is used, at least one of either this first phase-shift mask or the wafer may be exposed while being shifted a fixed distance along the optical axis. Moreover, the fixed distance may be determined in response to the amount of spherical aberrations of the exposure projection lenses. In this case, the pattern dimensional errors caused by defocus and/or spherical aberrations are averaged.

In other words, the present invention provides a pattern formation method characterized by dividing a Levinson phase-shift mask pattern into an isolated pattern portion and a dense pattern portion, and performing multifocal point exposure for the isolated pattern portion, thereby reducing aerial image variances and aberration effects due to defocus as well as significantly reducing the optical proximity effect, consequently allowing for marked improvement in dimensional accuracy.

BRIEF DESCRIPTION OF THE DRAWINGS

Features of the illustrative, non-limiting embodiments of the present invention will be more apparent from the following description taken in conjunction with the accompanying drawings, in which:

FIGS. 1A through 1C are top views illustrating an exemplary embodiment of a pattern formation method according to the present invention, wherein FIG. 1A is a phase-shift mask used in a first exposure, FIG. 1B is a phase-shift mask used in a second exposure, and FIG. 1C is a circuit pattern formed through these exposures;

FIGS. 4A and 4B are graphs showing light intensity distribution at given positions upon a wafer according to the exemplary embodiment of the present invention, wherein FIG. 4A is the light intensity distribution for each focal point, and FIG. 4B is the light intensity distribution that is averaged through multifocal point exposure;

FIGS. 9A through 9C are top views illustrating a pattern formation method through conventional phase-shift exposure, wherein FIG. 9A is a phase-shift mask used in a first exposure, FIG. 9B is a normal mask used in a second exposure, and FIG. 9C is a circuit pattern formed through these exposures;

DETAILED DESCRIPTION OF THE EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

Figure 1A:
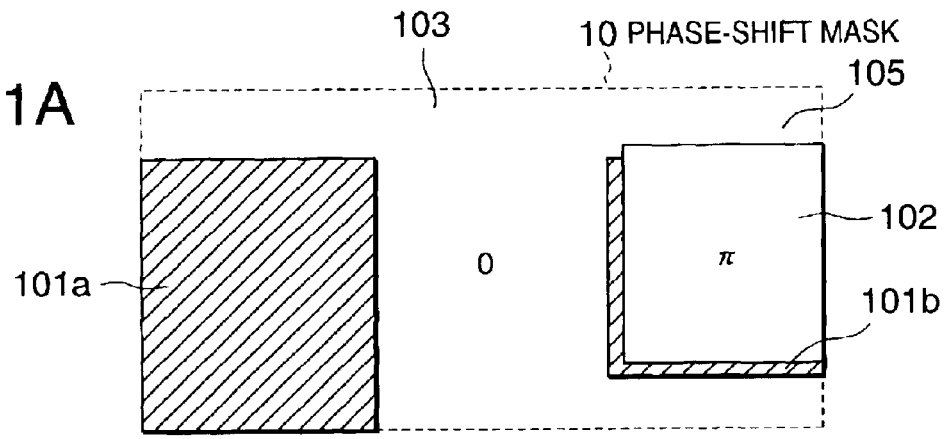
Figure 1B:
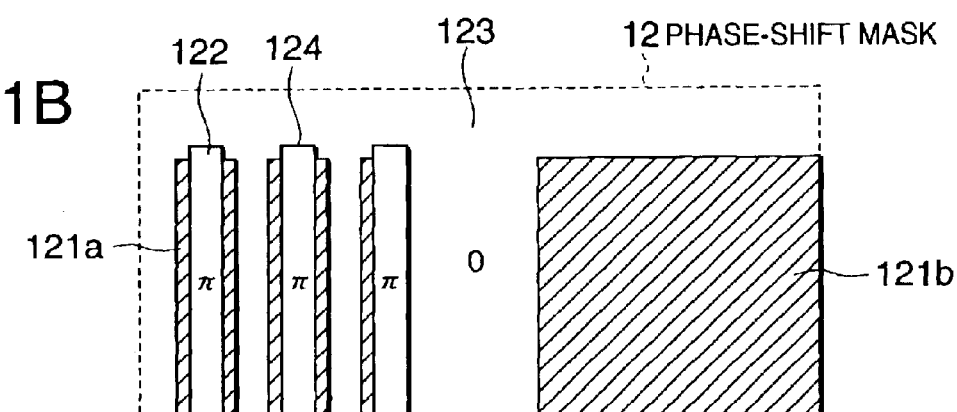
Figure 1C:
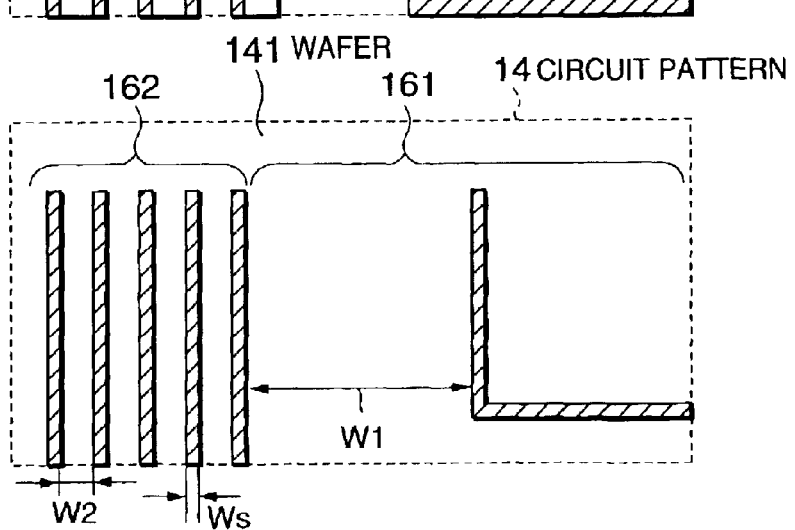

FIGS. 1A through 1C are top views illustrating an exemplary embodiment of a pattern formation method according to the present invention, wherein FIG. 1A is a phase-shift mask used in a first exposure, FIG. 1B is a phase-shift mask used in a second exposure, and FIG. 1C is a circuit pattern formed, for example, upon a photoresist layer through these exposures. Description thereof is based on these drawings hereinafter.

Figure 10:
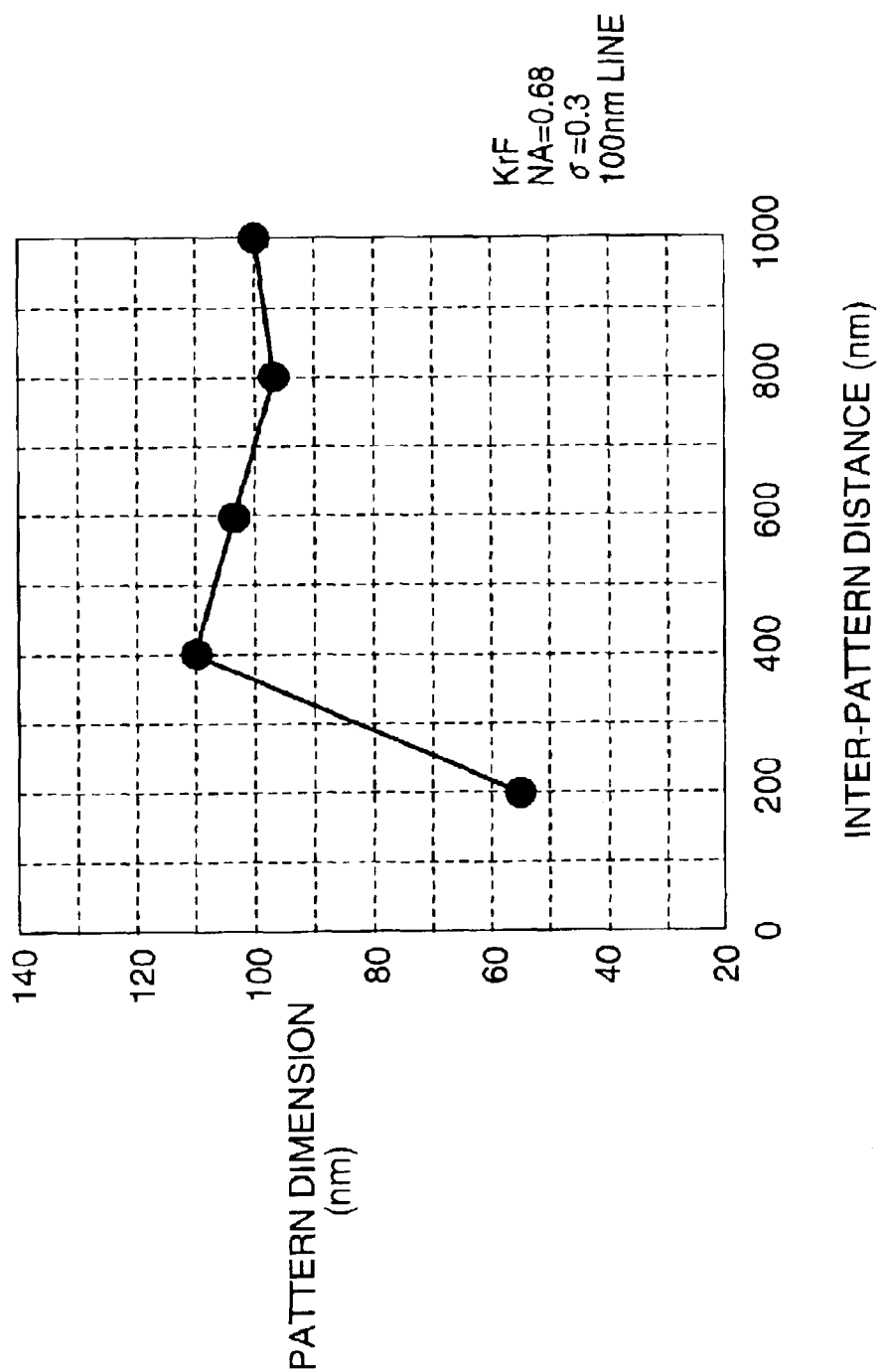
FIG. 10 is a graph showing the relationship between inter-pattern distance and pattern dimension for phase-shift exposure.
Figure 11:
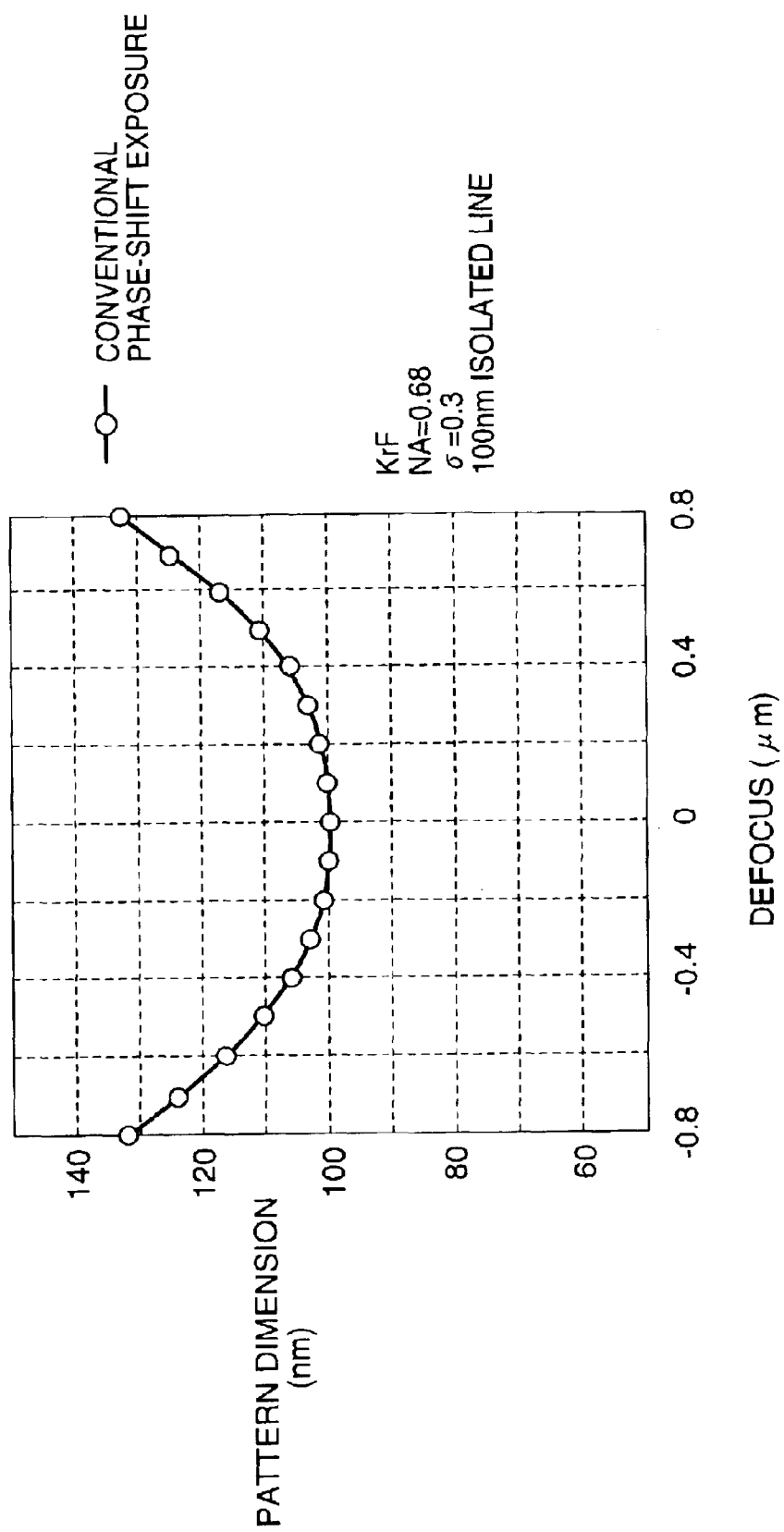
FIG. 11 is a graph showing CD-focus characteristics for conventional phase-shift exposure.

The pattern formation method of this embodiment is one that forms a circuit pattern 14 in a resist film upon a wafer 141 through exposures using phase-shift masks 10 and 12. As shown in FIG. 10, based on the relationship between inter-pattern distance W and pattern dimension $W_s$ where the pattern dimension $W_s$ significantly decreases when the inter-pattern distance W is under 400 nm, an isolated pattern 161 is defined as a pattern with an inter-pattern distance W1 of at least 400 nm, and a dense pattern 162 is a pattern with inter-pattern distances W2 under 400 nm. A phase-shift mask 10 is used for the isolated pattern 161, which is configured with a pattern where the inter-pattern distance W1 is at least 400 nm. A phase-shift mask 12 is used for the dense pattern 162, which is configured with patterns where the inter-pattern distances W2 are under 400 nm. An optical proximity effect depends on the inter-pattern distances W1 and W2 as well as exposure conditions. Accordingly, affects of the optical proximity effect may be eliminated by using the phase-shift masks 10 and 12, which differ in accordance with the inter-pattern distances W1 and W2 and providing optimum exposure conditions for the respective inter-pattern distances W1 and W2.

Furthermore, the phase-shift masks 10 and 12 include mask patterns designed so that unnecessary phase edge portions that are generated in one of either the phase-shift mask 10 or 12 are light areas in the other mask. Accordingly, the "normal mask" that has been conventionally necessary is eliminated. Namely, during the first exposure using the phase-shift mask 10, the photoelectric field at a border 105 of a phase-shifter [102] with a transmissive portion 103 is completely neutralized, forming an image with an extremely sharp dark area. This unnecessary phase edge becomes a transmissive portion 123 in the phase-shift mask 12, which is used in the second exposure. On the contrary, during the second exposure, an image with sharp dark areas is formed at borders 124 of phase-shifters 122 with the transmissive portion 123. However, this unnecessary phase edge portion is the transmissive portion 103 in the phase-shift mask 10 used in the first exposure.

The phase-shift masks 10 and 12 are positive type Levinson phase-shift masks. A Levinson phase-shift mask is extremely effective in resolution and focal depth improvement, and ultrafine patterns of less than half the exposure wavelength may also be formed. Here, a case is given where, for example, a device with minimum line widths of approximately 100 nm such as the circuit pattern 14 in a gate layer is exposed by a projection scanner using a KrF excimer laser as the light source. In this embodiment, the circuit pattern 14 is formed through double exposure using the phase-shift masks 10 and 12, respectively. At this time, during exposure that uses the phase-shift mask 10, the wafer 141 is moved along the optical axis so as to perform exposure at a plurality of image focal plane.

Figure 2:
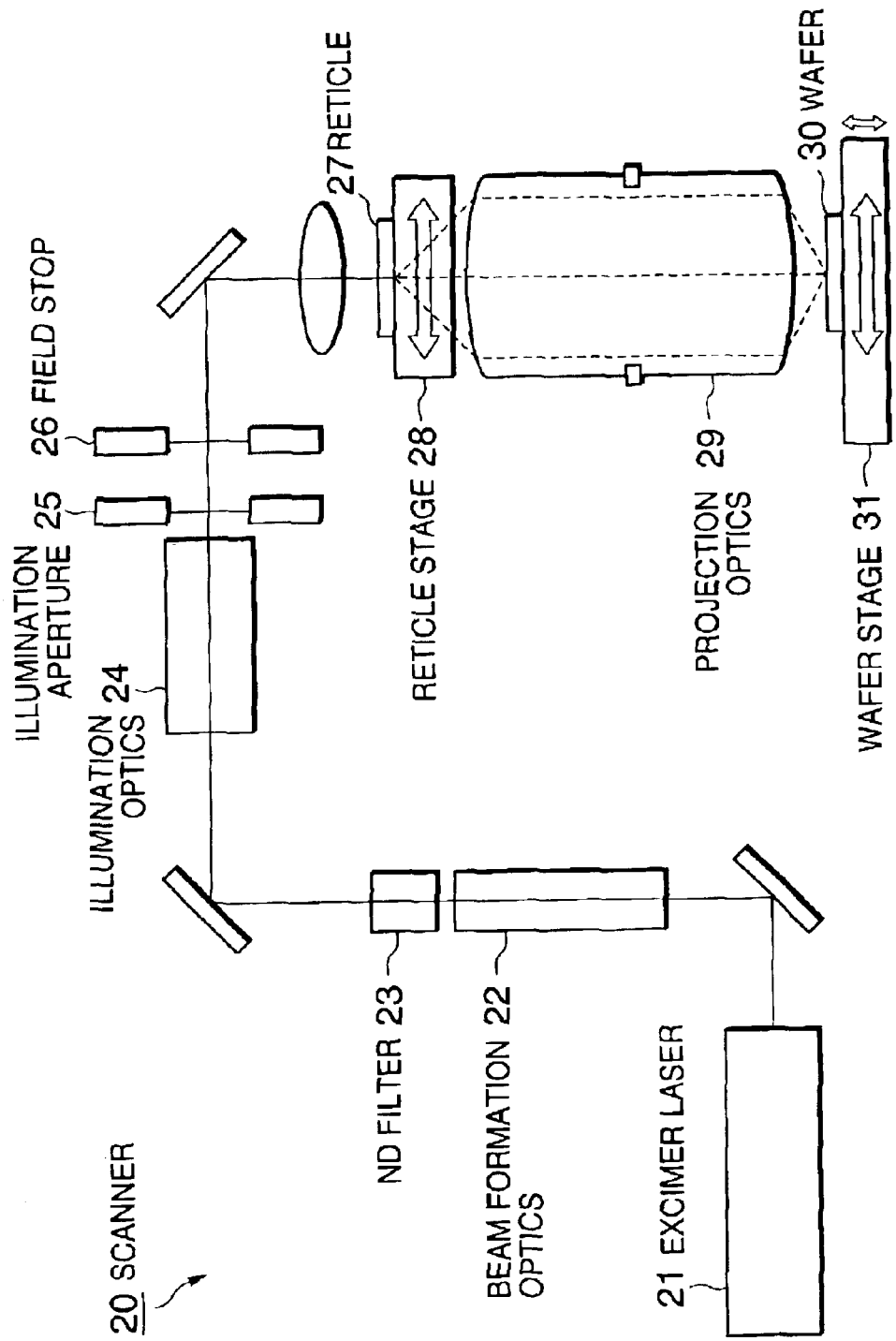
FIG. 2 is a schematic diagram illustrating a scanner for use in the exemplary embodiment of the present invention.

FIG. 2 is a schematic diagram illustrating a scanner that is used in this embodiment. Description thereof is based on this drawing hereinafter.

A scanner 20 is a step-and-scan scanner with a KrF excimer laser as the light source, and comprises an excimer laser 21, a beam formation optics 22, an ND filter 23, an illumination optics 24, an illumination aperture 25, a field stop 26, a reticle 27 (mask), a reticle stage 28, a projection optics 29, a wafer 30, and a wafer stage 31 and the like. A KrF excimer laser light radiated from the excimer laser 21 passes through the beam formation optics 22, illumination optics 24, field stop 26 and the like so as to be formed into a slit-shaped light flux, and radiated upon the reticle 27. The reticle 27 and wafer 30 are synchronously scanned below this illuminated region at a speed in accordance with the reduction scaling factor, whereby a pattern is transcribed onto the wafer 30. Here, the numerical aperture (NA) for the projection optics 29 is 0.68 and the coherence factor (σ) for the illumination optics 24 is 0.3. Furthermore, an optical axis shift mechanism including, for example a piezo element, which adjusts height along the optical axis (Z direction) is provided for the wafer stage 31.

Figure 3:
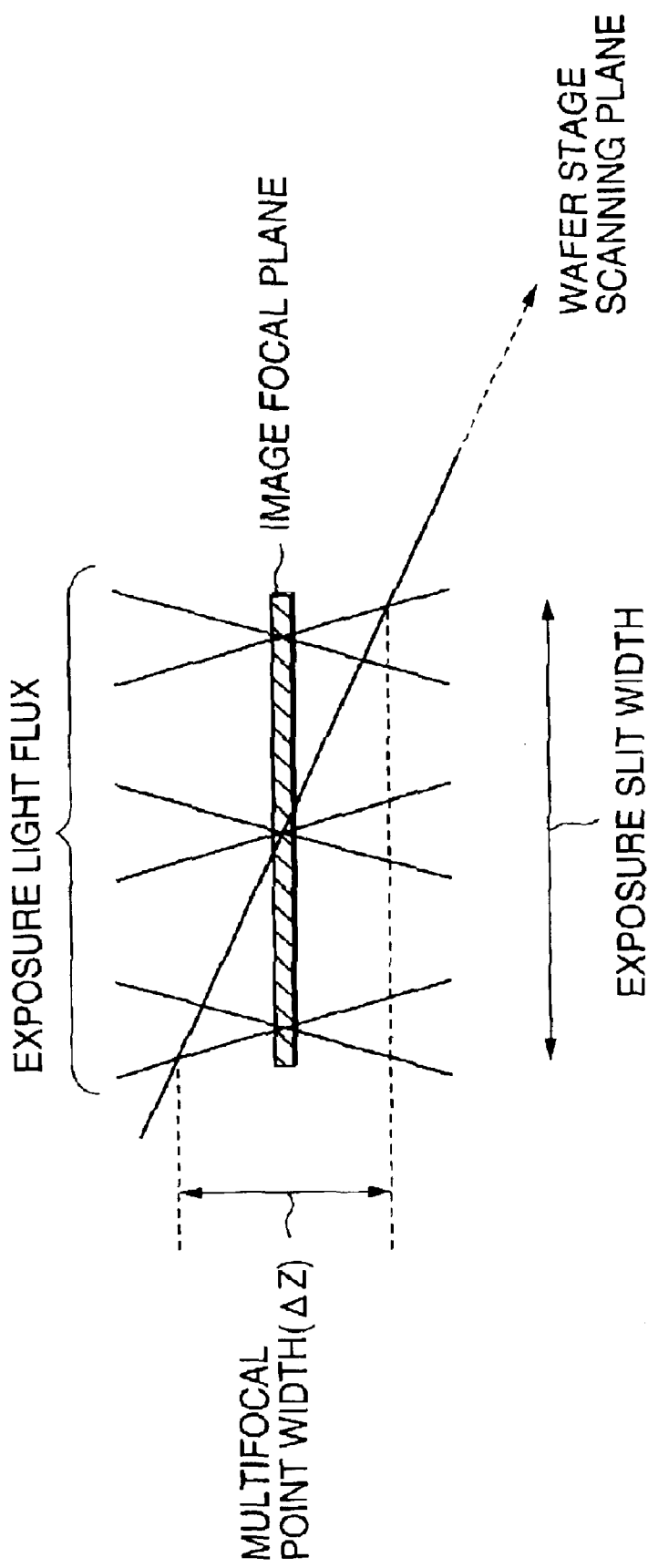
FIG. 3 is an exemplary drawing showing exposure operation according to the exemplary embodiment of the present invention.
Figure 4:
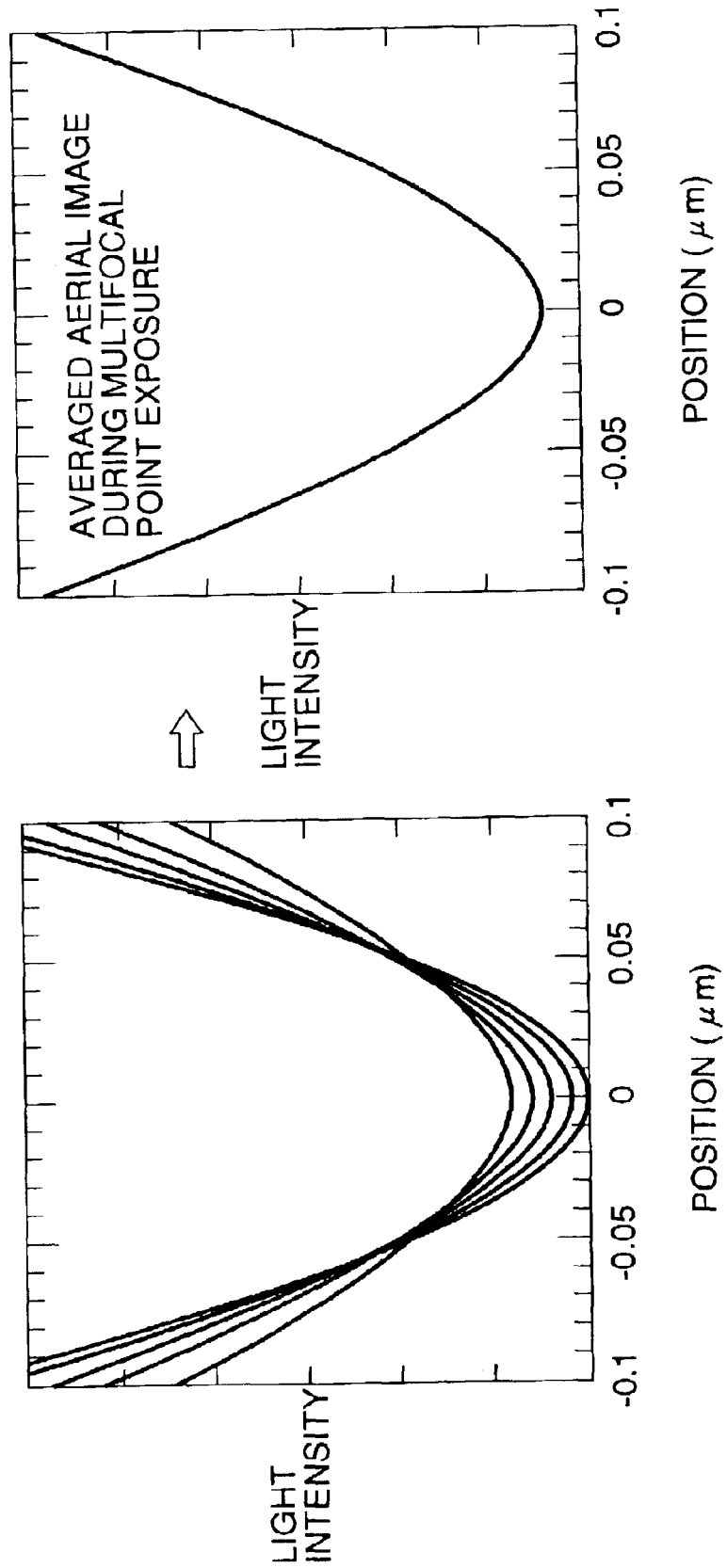

FIG. 3 is an exemplary drawing showing exposure operation according to this embodiment. FIGS. 4A and 4B are graphs showing light intensity distribution at given positions upon a wafer according to this embodiment, wherein FIG. 4A is the light intensity distribution for each focal point, and FIG. 4B is the light intensity distribution that is averaged through multifocal point exposure. Description thereof is based on FIG. 1 through FIG. 4 hereinafter.

With the first exposure, the isolated pattern 161 is exposed using the phase-shift mask 10 of FIG. 1A. At this time, optimized values of exposure amount and focus offset are used for the isolated pattern 161. A light shielding portion 101b is provided to the phase-shift mask 10, and the phase-shifter 102 is provided on one of the neighboring sides of the light shielding portion 101b. On another neighboring side is the transmissive portion 103. Accordingly, the phases of the exposure light that pass through both sides of the light shielding portion 101b come to only differ exactly 180 from each other. Thus, the photoelectric field in the vicinity of the border of the phase-shifter 102 with the transmissive portion 103 is completely neutralized, forming an image with an extremely sharp dark area. At this time, optimized values of exposure amount and focus offset are used for the isolated pattern 161. Accordingly, formation of ultrafine patterns is possible.

Multifocal point exposure is performed in this first exposure. Multifocal point exposure is performed by changing the height along the optical axis (Z direction) of the wafer stage 31 during the exposing period. In the case of the scanner 20 as in FIG. 2, the height of the wafer stage 31 is continuously changed. As in FIG. 3, the amount of defocus within the exposure slit is continuously changed by slanting the scanning plane of the wafer stage 31 with respect to the image focal plane. The ultimately formed aerial image, as shown in FIG. 4B, is an averaged aerial image that changes along with defocus.

For example, multifocal point width ΔZ is set to be 1 μm in this embodiment. In this case, if defocus at the starting point of scan exposure is given as +0.5 μm, the defocus begins to change in the minus direction as scanning progresses so that the defocus is −0.5 μm at the finishing point of scan exposure. The ultimately formed aerial image, as shown in FIG. 4, is an averaged aerial image that changes from +0.5 μm to −0.5 μm along with defocus.

With the second exposure, the dense pattern 162 is exposed using the phase-shift mask 12 of FIG. 1B. The phase-shift mask 12, similarly with the phase-shift mask 10, is also provided with light shielding portions 121a, and the phase-shifters 122 are provided on one neighboring side of the light shielding portions 121a. On another neighboring side is the transmissive portion 123. Accordingly, the phases of the exposure light that pass through both sides of the light shielding portions [121a] come to only differ exactly 180 from each other. At this time, optimized values of exposure amount and focus offset are used for the isolated pattern 162. In this embodiment, the amount of exposure for the dense pattern 162 is set to be approximately 70% that of the exposure for the isolated pattern 161. The circuit pattern 14 of FIG. 1C is then achieved through executing a development procedure.

Incidentally, with the first exposure, unnecessary dark areas also generate at edge portions of the phase-shifter 102, namely at the border 105 of the phase-shifter 102 with the transmissive portion 103 other than the desired circuit pattern 14. Since all regions of the L-shaped pattern formed through the first phase-shift exposure are shielded from the light so as to expose the remaining regions using the phase-shift mask 12 of FIG. 1B in the second exposure, the unnecessary dark areas caused by the border 105 of the phase-shifter 102 with the transmissive portion 103 are eliminated. Furthermore, with only exposure of the phase-shift mask 12 used in the second exposure, unnecessary dark areas generate at edge portions of the phase-shifters 122, namely at borders 124 of the phase-shifters 122 with the transmissive portion 123. Given this, since all regions of the 100 nm width line pattern formed through the second phase-shift exposure are shielded from the light so as to expose the remaining regions using the phase-shift mask 10 of FIG. 1A in the first exposure, the unnecessary dark areas caused by the borders 124 of the phase-shifters 122 with the transmissive portion 123 are eliminated. In other words, each exposure also serves as exposure for preventing unnecessary dark areas at the borders of the phase-shifters with the transmissive portion from forming into resist patterns.

Furthermore, in FIG. 2, multifocal point exposure is performed while changing the height along the optical axis (Z direction) of the wafer stage 31 during the exposing period. In the case of the scanner 20, the height of the wafer stage 31 is continuously changed. As in FIG. 3, the amount of defocus within the exposure slit is continuously changed by slanting the scanning plane of the wafer stage 31 with respect to the image focal plane. The ultimately formed aerial image, as in FIG. 4, is an averaged aerial image that changes along with defocus.

It should be noted that the reason for performing multifocal point exposure for only the isolated pattern 161 is that in comparison to the dense pattern 162, changes due to defocus in the aerial image of the isolated pattern 161 are significant, and is also easily affected by aberrations.

Figure 5:
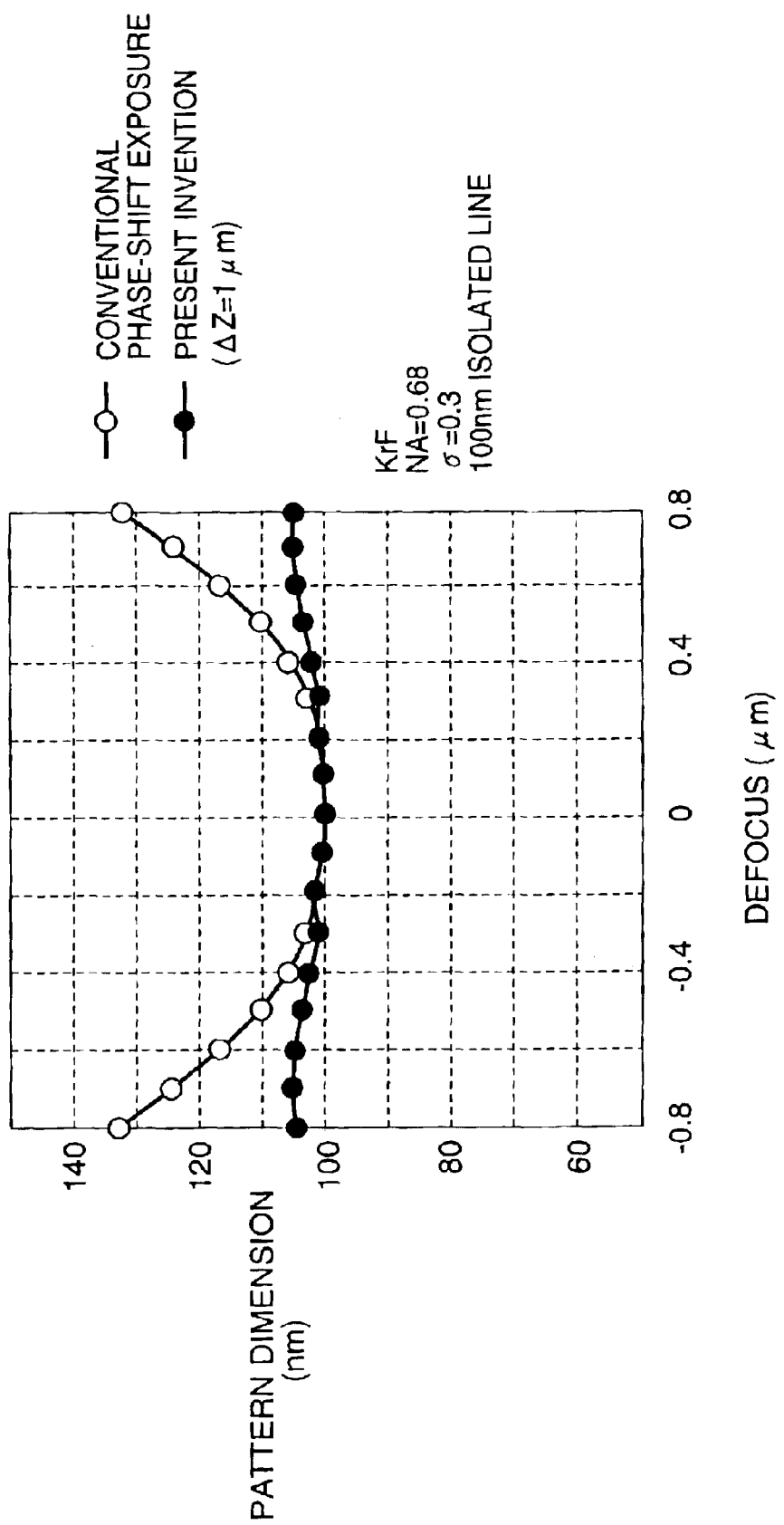
FIG. 5 is a graph showing CD-focus characteristics for phase-shift exposure according to the exemplary embodiment of the present invention and conventional phase-shift exposure.
Figure 6:
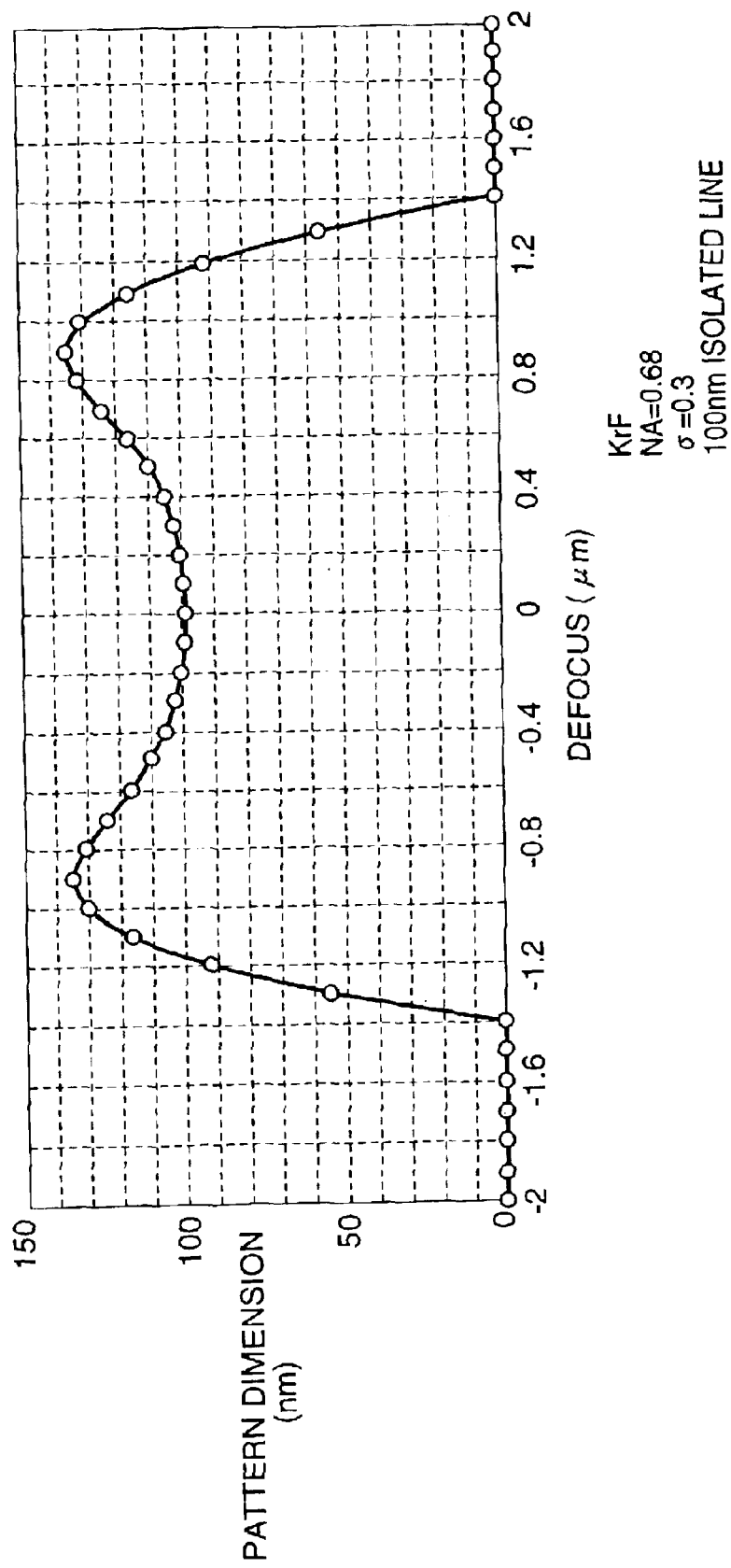
FIG. 6 is a graph showing CD-focus characteristics plotted on a wide range lateral axis for conventional phase-shift exposure.

FIG. 5 and FIG. 6 are graphs showing CD-focus characteristics (relationship between defocus and pattern dimension) in the case of an isolated pattern with no aberrations, wherein FIG. 5 is for comparison of phase-shift exposure of this embodiment with conventional phase-shift exposure, and FIG. 6 is one where the lateral axis covers a wide range for the conventional phase-shift exposure. Description thereof is based on these drawings hereinafter.

"Defocus" in this embodiment represents the average value (center value) of multifocal point width. For example, a defocus of 0 $\mu$m means multifocal point exposure from 0.5 $\mu$m to −0.5 $\mu$m, and a defocus of +0.5 $\mu$m means multifocal point exposure from +1 $\mu$m to 0 $\mu$m.

As previously mentioned, NA for the projection optics is 0.68, $\sigma$ for the illumination optics is 0.3, and the multifocal point width ($\Delta$Z) is 1 $\mu$m. If there are no aberrations, focal asymmetry does not develop. However, in prior arts, even if there are no aberrations, problems have been found where pattern dimensions drastically thicken as defocus increases. With this embodiment, however, dimension variance due to defocus is small, thus allowing for focal depth extension and dimensional accuracy improvement.

Figure 7:
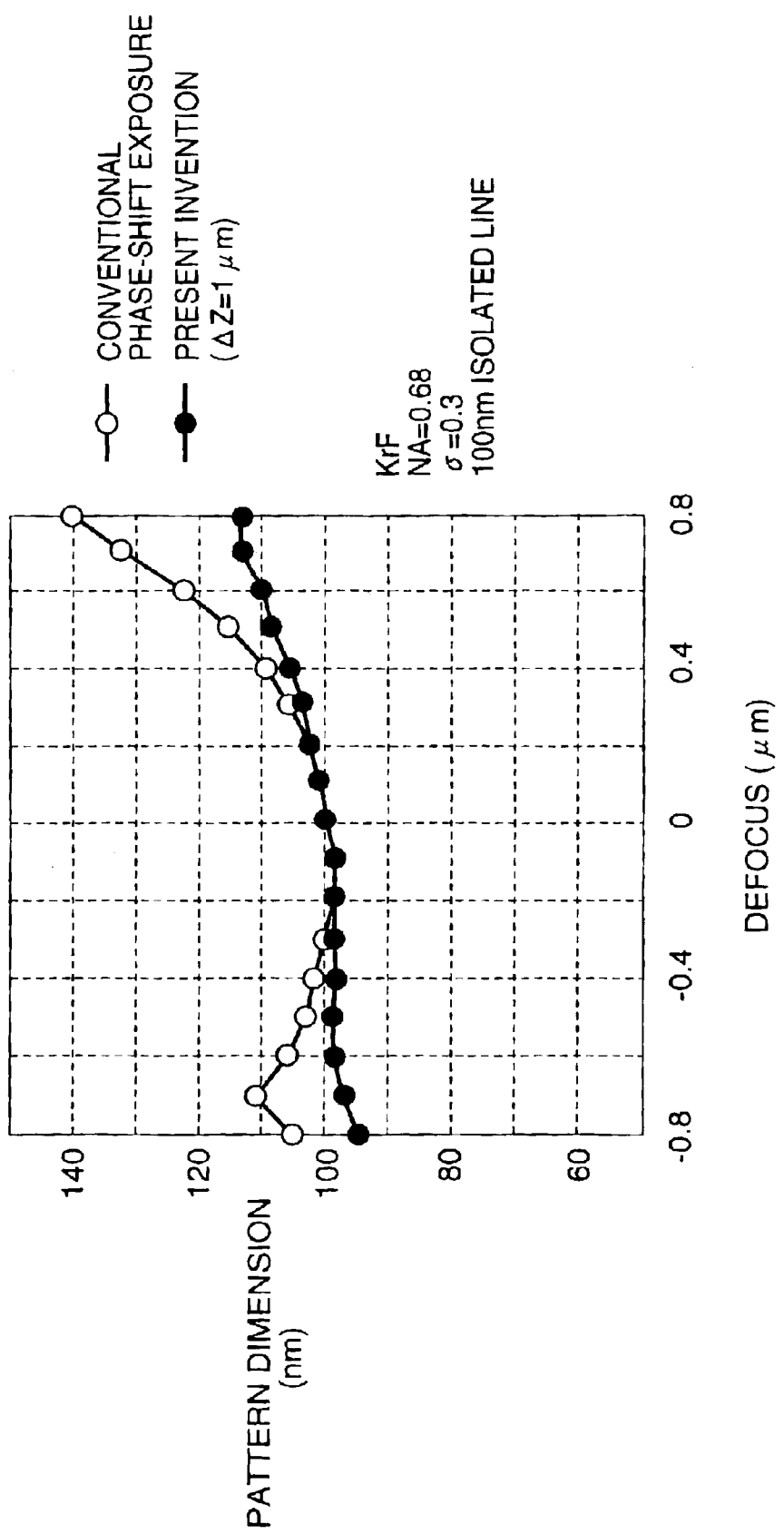
FIG. 7 is a graph showing CD-focus characteristics for phase-shift exposure according to the exemplary embodiment of the present invention and conventional phase-shift exposure (in the case where there are spherical aberrations in either the present invention or prior arts)

FIG. 7 is a graph showing CD-focus characteristics for phase-shift exposure of this embodiment and conventional phase-shift exposure in the case where there are spherical aberrations of 0.025 $\lambda$. Description thereof is based on this drawing hereinafter.

Figure 12:
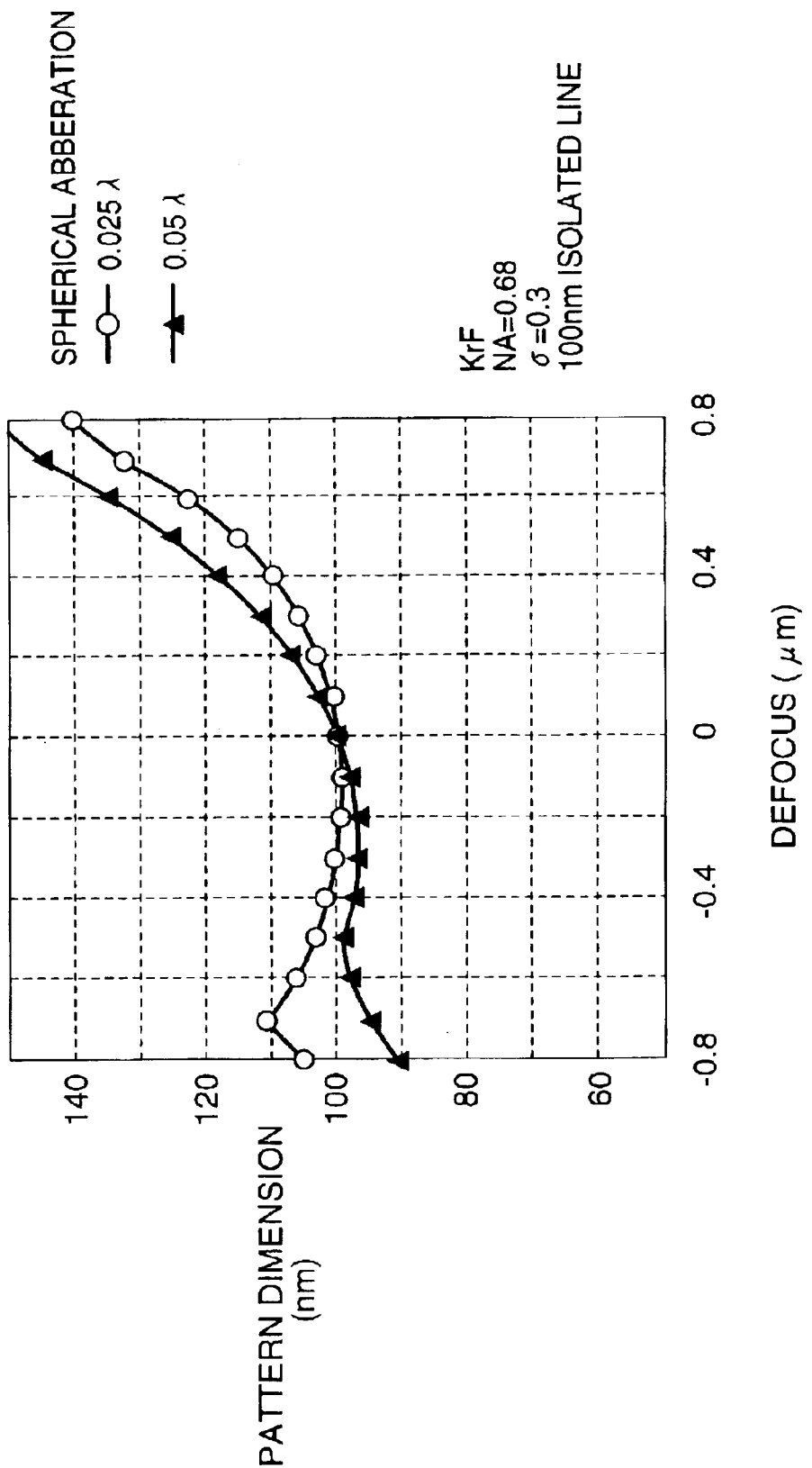
FIG. 12 is a graph showing CD-focus characteristics for conventional phase-shift exposure (when there are spherical aberrations).

Phase-shift exposure is easily affected by aberrations, and in prior arts as shown in FIG. 12, aberrations in +, − defocusing are noticeable. With this embodiment, however, the ability to improve asymmetry through the averaging effect of the aerial image allows the dimensional accuracy to be significantly improved. At this time, the fixed distance that either one of the phase-shift mask or the wafer should be shifted along the optical axis is determined with consideration of asymmetry so that the average error in pattern dimension can be 0. Furthermore, if spherical aberrations exist, significant deviation in the best focus for dense patterns and isolated patterns develop. Accordingly, separately setting respective focus offsets for dense pattern exposure and isolated pattern exposure allows for avoiding this problem as well.

Figure 8:
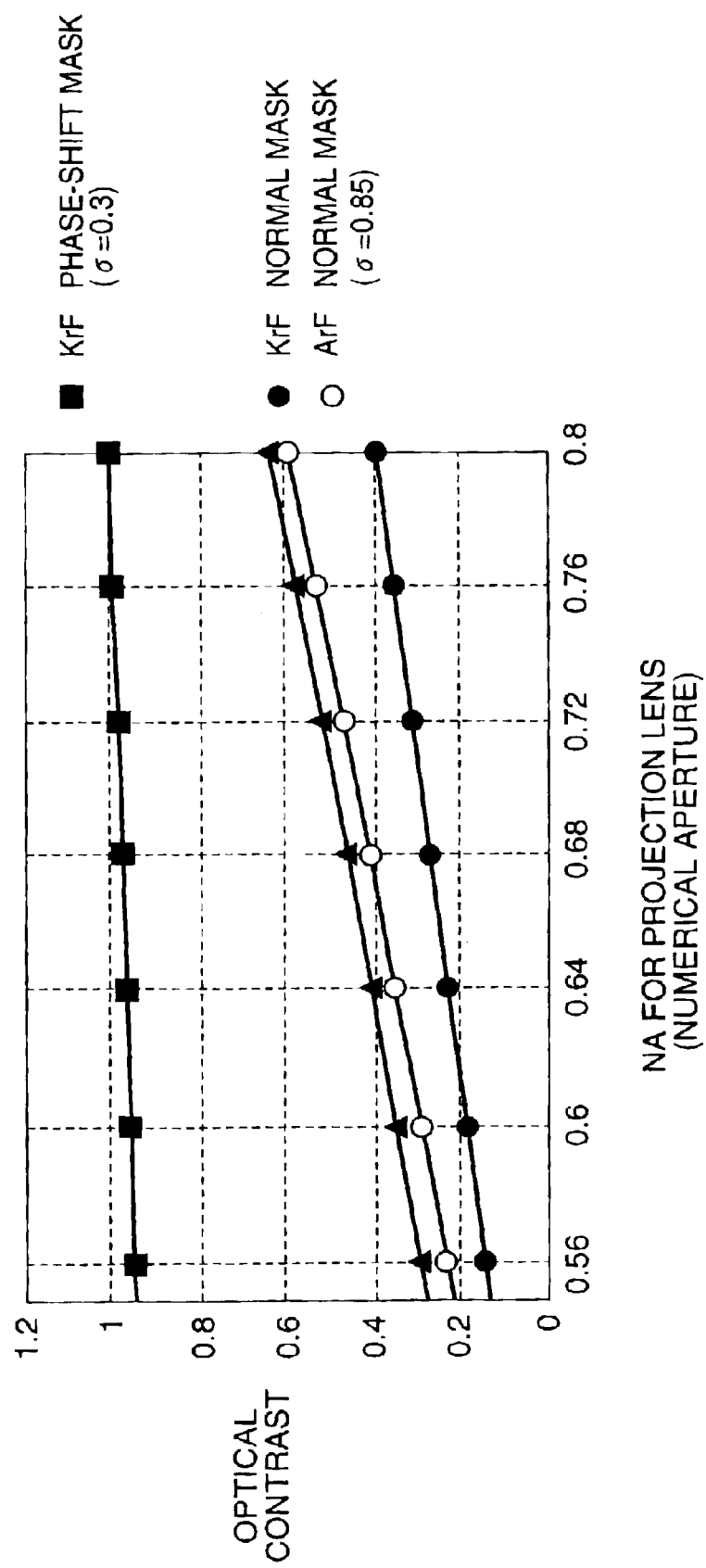
FIG. 8 is a graph showing optical contrast for a 100 nm isolated line in KrF excimer laser exposure (wavelength 248 nm) and ArF excimer laser exposure (wavelength 193 nm)
Figure 9A:
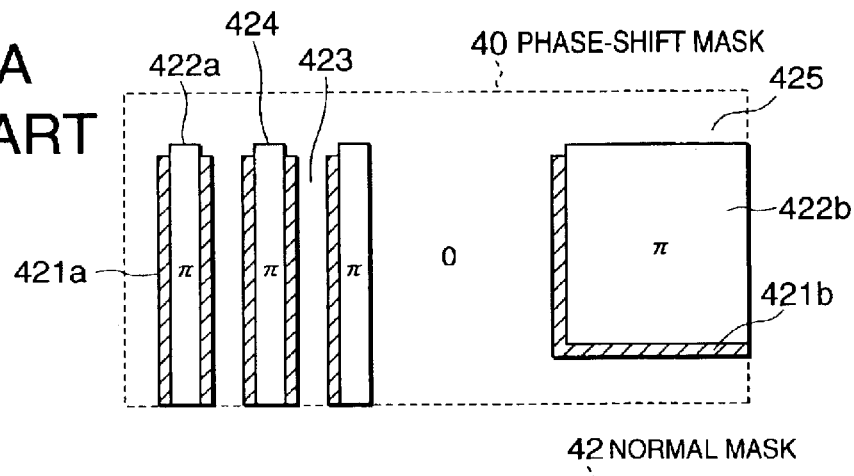
Figure 9B:
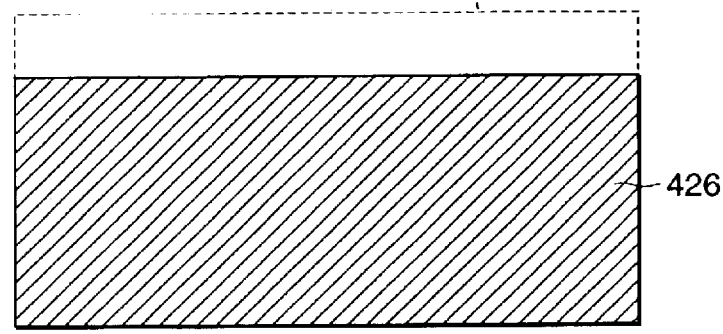
Figure 9C:
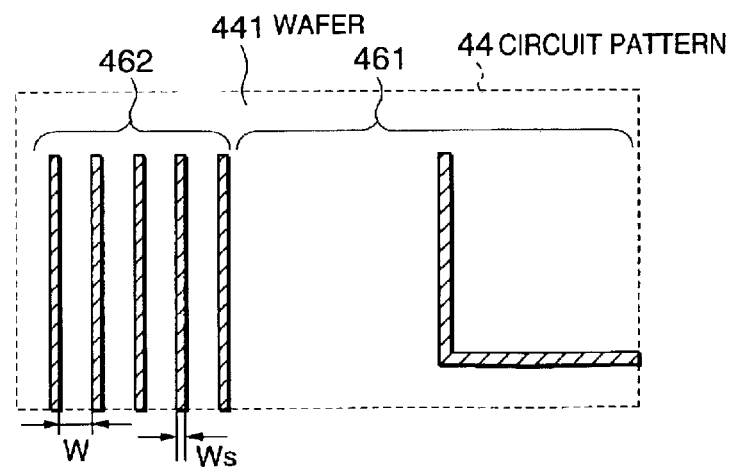

Next, the present embodiment is summarized. Since optical contrast with multifocal point exposure decreases in comparison with normal exposure methods, formation of ultrafine patterns (especially positive type patterns) has been generally thought as being impossible. However, since the Levinson phase-shift mask (see FIG. 8) with extremely high optical contrast is used in this embodiment, resolvable high contrast may sufficiently be maintained even if the multifocal point width is broadly set to be at least 2 $\mu$m.

It should be noted that an example using a scan exposure apparatus has been given in the above embodiment, however, a batch exposure apparatus (stepper) may also be used. In the case of the batch exposure apparatus, wafer stage height may be continuously changed during the exposure period as with the scan exposure apparatus, and the amount of defocus may be discretely changed by executing exposure a plurality of times and changing the wafer stage height between each execution.

Furthermore, an example of changing wafer stage height, namely wafer height has been given in the above embodiment; naturally, however, the same results may be obtained by changing the height of a mask stage with the projection scaling factor under consideration.

Moreover, an example particularly using a positive type Levinson phase-shift mask has been given in the above embodiment, however, the present invention may also be applied to a phase-shift mask such as a halftone phase-shift mask or rim type halftone phase-shift mask, obtaining the same results. It should be noted that the rim type halftone phase-shift mask is one where only areas near aperture portion edges are halftoned.

According to the pattern formation method according to the present invention, by using phase-shift masks that differ according to inter-pattern distance and performing exposure under different conditions, affects of the optical proximity effect that depend upon inter-pattern distances and exposure conditions can be accurately removed.

Furthermore, since one phase-shift mask having a mask pattern that eliminates the phase edges generated in another phase-shift mask allows functions of the normal mask to be used along with the phase-shift mask, the normal mask may be eliminated.

Moreover, since errors in pattern dimensions caused by defocus and spherical aberrations are averaged by executing exposure while shifting at least one of either the phase-shift mask or the wafer along the optical axis for a fixed distance, dimensional accuracy may be improved.

Particularly in the case where a positive type Levinson phase-shift mask is used as the phase-shift mask, compensation for reduction in optical contrast, which is a defect of multifocal point exposure, is possible due to the fact that extremely high optical contrast is obtainable, allowing for resolvable high contrast to be sufficiently maintained even if the multifocal point width is broadly set to be at least 2 $\mu$m, for example.

Furthermore, dimensional accuracy may be significantly improved since phase shift exposure defects easily affected by spherical aberrations may be improved through the aerial image averaging effect by determining the fixed distance at least one of either the phase-shift mask or the wafer should be shifted along the optical axis in response to the amount of spherical aberrations of the exposure projection lenses.

In other words, according to the present invention, since the optimum exposure amount and focus offset may be separately set for dense patterns and isolated patterns, respectively, affects of the optical proximity effect, which is a defect of phase-shift exposure, may be considerably improved. According to the example shown in FIG. 10, with the definition of a dense pattern being a region having inter-pattern distances under 400 nm, and an isolated pattern being a region having [inter-pattern distances] at least 400 nm, respective exposures should be performed using separate amounts of exposure. Furthermore, should deviation in the best focus for dense patterns and isolated patterns develop due to phase error and the like in phase-shift masks, this problem may be avoided by separately setting respective focus offsets.

The present invention is not limited to the above embodiments, and it is contemplated that numerous modifications may be made without departing from the spirit and scope of the invention. The semiconductor device, as described above with reference to the figures, [is merely] an exemplary embodiment of the invention, and the scope of the invention is not limited to these particular embodiments. For example, the specific layers and materials that are used to create the semiconductor devices of the non-limiting embodiments are merely examples, and one skilled in the art will readily know that the present invention can be applied to devices containing different layers and materials. Accordingly, other structural configurations may be used, without departing from the sprit and scope of the invention as defined in the claims.

What is claimed is:

1. A method of manufacturing a semiconductor device, said semiconductor device comprising a first pattern, a second pattern disposed next to said first pattern with a first inter-pattern distance between said first pattern and said second pattern, and a third pattern disposed next to said second pattern with a second inter-pattern distance between said second pattern and said third pattern, comprising:

exposing a resist film over a substrate by using a first mask having a first light shielding portion corresponding to said first pattern; and exposing said resist film by using a second mask having a second light shielding portion and a third light shielding portion corresponding to said second pattern and said third pattern, respectively, wherein said first inter-pattern distance is larger than said second inter-pattern distance.

2. The method as claimed in claim 1, wherein said exposing said resist film by using said first mask is conducted under a first condition of optimized values of exposure amount and focus offset, which is different from a second condition of said optimized values under which said exposing said resist film by using said second mask is conducted.

3. The method as claimed in claim 2, wherein said exposure amount in said exposing said resist film by using said second mask is smaller than said exposing said resist film by using said first mask.

4. The method as claimed in claim 1, wherein said first inter-pattern distance is larger than a predetermined value, and said second inter-pattern distance is smaller than said predetermined value.

5. The method as claimed in claim 4, wherein said predetermined value is 400 nm.

6. The method as claimed in claim 1, wherein said fist mask and said second mask are a first phase-shift mask and a second phase-shift mask, respectively.

7. The method as claimed in claim 6, wherein said first phase-shift mask has a border of a phase-shifter with a transmissive portion, and said border corresponds to a transmissive portion in said second phase-shift mask.

8. The method as claimed in claim 6, wherein said second phase-shift mask has a border of a phase-shifter with a transimissive portion, and said border corresponds to a transmissive portion in said first phase-shift mask.

9. The method as claimed in claim 6, wherein said exposing said resist film by using said first phase-shift mask is conducted while at least one of either said first phase-shift mask or said substrate is shifted along an optical axis.

10. The method as claimed in claim 6, wherein said optical axis is in response to an amount of spherical aberrations of the exposure projection lenses.

11. The method as claimed in claim 6, wherein said exposing said resist film by using said first phase-shift mask is conducted while at least one of either said first phase-shift mask or said substrate is shifted along an optical axis.

12. A method of manufacturing a semiconductor device, said semiconductor device comprising, a first pattern which has a line shaped portion, a second pattern which is a line shaped pattern parallel to said line shape portion with a first inter-pattern distance between said line shaped portion of said first pattern and said second pattern, and a third pattern which is said line shaped pattern parallel to said second pattern with a second inter-pattern distance between said second pattern and said third pattern, said first inter-pattern distance being larger than said second inter-pattern distance, comprising:

exposing a resist film over a substrate by using a first phase-shift mask having:
 a first light shielding portion corresponding to said first pattern,
 a first transmissive portion formed adjacent to one side of said line shaped portion of said first light shielding portion, and
 a first phase-shifter formed adjacent to the other side of said line shaped portion of said first light shielding portion;

exposing said resist film by using a second phase-shift mask having a second light shielding portion and said third light shielding portion corresponding to said second pattern, and said third pattern, respectively, said second phase-shift mask further comprising:
 a second phase-shifter formed between said first transmissive portion and said second light shielding portion, and
 a second transmissive portion formed between said second light shielding portion and said third shielding portion, wherein said resist film corresponding to a border of said first transmissive portion with said second phase shifter is exposed by said exposing said resist film by using said second phase-shift mask.

* * * * *